(12) United States Patent
Nakano et al.

(10) Patent No.: US 10,825,949 B2
(45) Date of Patent: Nov. 3, 2020

(54) METHOD OF MANUFACTURING LIGHT EMITTING DEVICE

(71) Applicant: NICHIA CORPORATION, Anan-shi (JP)

(72) Inventors: Makoto Nakano, Anan (JP); Kenji Nakata, Anan (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 16/550,908

(22) Filed: Aug. 26, 2019

(65) Prior Publication Data

US 2020/0066933 A1  Feb. 27, 2020

(30) Foreign Application Priority Data

Aug. 27, 2018 (JP) .................. 2018-158528
May 13, 2019 (JP) .................. 2019-090621

(51) Int. Cl.
*H01L 33/00* (2010.01)
*H01L 33/56* (2010.01)

(52) U.S. Cl.
CPC ............ *H01L 33/005* (2013.01); *H01L 33/56* (2013.01); *H01L 2933/005* (2013.01); *H01L 2933/0025* (2013.01); *H01L 2933/0041* (2013.01)

(58) Field of Classification Search
None
See application file for complete search history.

(56) References Cited

U.S. PATENT DOCUMENTS

| | | |
|---|---|---|
| 2005/0127378 A1 | 6/2005 | Suehiro et al. |
| 2009/0050911 A1 | 2/2009 | Chakraborty |
| 2014/0246689 A1 | 9/2014 | Luo et al. |
| 2015/0263245 A1 | 9/2015 | Akagawa et al. |
| 2016/0081142 A1 | 3/2016 | Abe et al. |
| 2016/0111610 A1 | 4/2016 | Ota et al. |
| 2016/0233396 A1 | 8/2016 | Ota et al. |

(Continued)

FOREIGN PATENT DOCUMENTS

| | | |
|---|---|---|
| EP | 2074668 A1 | 7/2009 |
| EP | 3000863 A1 | 3/2016 |
| JP | 2005167091 A | 6/2005 |

(Continued)

*Primary Examiner* — Jack S Chen
(74) *Attorney, Agent, or Firm* — Hunton Andrews Kurth LLP

(57) ABSTRACT

Provided is a method of manufacturing a light emitting device, comprising: preparing a base body having a concave portion; disposing a light emitting element at the bottom of the concave portion; disposing a first resin containing first phosphor particles having an average particle size of 10 μm or more and 30 μm or less and a first filler having an average particle size of 5 μm or more and 20 μm or less to cover the light emitting element; centrifugally precipitating the first phosphor particles and the first filler toward the base body; temporarily curing the first resin; disposing a second resin containing second phosphor particles and a second filler having an average particle size of 5 nm or more and 100 nm or less on the first resin temporarily cured; centrifugally precipitating the second phosphor particles and the second filler toward the first resin; and curing the first and second resins.

10 Claims, 6 Drawing Sheets

(56) References Cited

U.S. PATENT DOCUMENTS

2016/0322542 A1   11/2016   Akagawa et al.
2020/0066933 A1 *  2/2020   Nakano .................. H01L 33/56

FOREIGN PATENT DOCUMENTS

| | | |
|---|---|---|
| JP | 2009054995 A | 3/2009 |
| JP | 2014086520 A | 5/2014 |
| JP | 2014170938 A | 9/2014 |
| JP | 2015211076 A | 11/2015 |
| JP | 2016058614 A | 4/2016 |
| JP | 2016072412 A | 5/2016 |
| JP | 2016082212 A | 5/2016 |
| JP | 2017069457 A | 4/2017 |
| WO | 2008/043519 A1 | 4/2008 |
| WO | 2017/217549 A1 | 12/2017 |

\* cited by examiner

METHOD OF MANUFACTURING LIGHT EMITTING DEVICE

CROSS-REFERENCE TO RELATED APPLICATION

This application claims priority to Japanese Patent Application No. 2018-158528, filed on Aug. 27, 2018, and Japanese Patent Application No. 2019-090621, filed on May 13, 2019, the contents of which are hereby incorporated by reference in their entireties.

BACKGROUND

Field

The present disclosure relates to a method of manufacturing a light emitting device.

Description of the Related Art

In recent years, light emitting devices including semiconductor light emitting elements have been widely used in lighting fixtures and the like. For example, JP 2014-170938 A discloses a light emitting device that includes a plurality of phosphor layers on a light emitting element, such as a light-emitting diode. According to the description of JP 2014-170938 A, it is said that the light emitting device of this patent document can reduce non-uniform color distribution.

However, in the case of a light emitting device including a plurality of phosphor layers, the distribution state of phosphor particles in each phosphor layer may vary among light emitting devices. This leads to a problem of variations in the emission color among the light emitting devices.

SUMMARY

Therefore, it is an object of the present disclosure to provide a method of manufacturing a light emitting device which can manufacture a light emitting device including a plurality of phosphor layers so as to suppress variations in the emission color among the manufactured light emitting devices.

A method of manufacturing a light emitting device in an embodiment according to the present disclosure includes:
- a base body preparation step of preparing a base body having a concave portion;
- a disposition step of disposing a light emitting element at a bottom surface of the concave portion;
- a first resin disposing step of disposing a first resin to cover the light emitting element, the first resin containing first phosphor particles having an average particle size of 10 μm or more and 30 μm or less and a first filler having an average particle size of 5 μm or more and 20 μm or less;
  - a first centrifugal precipitation step of centrifugally precipitating the first phosphor particles and the first filler toward the base body;
  - a temporary curing step of temporarily curing the first resin;
- a second resin disposing step of disposing a second resin on the first resin temporarily cured, the second resin containing second phosphor particles and a second filler having an average particle size of 5 nm or more and 100 nm or less;
  - a second centrifugal precipitation step of centrifugally precipitating the second phosphor particles and the second filler toward the first resin; and
- a curing step of curing the first resin and the second resin.

The method of manufacturing a light emitting device configured as mentioned above includes the first centrifugal precipitation step and the temporary curing step after the first resin disposing step, as well as the second centrifugal precipitation step after the second resin disposing step, thereby making it possible to reduce variations in the distribution state of the phosphor particles in each phosphor layer among light emitting devices. Thus, the method can manufacture light emitting devices with small variations in the emission color.

DETAILED DESCRIPTION

A method of manufacturing a light emitting device in embodiments according to the present disclosure will be described below.

First Embodiment

The method of manufacturing a light emitting device in the first embodiment may include a base body preparation step, a disposition step, a first resin disposing step, a first centrifugal precipitation step, a temporary curing step, a second resin disposing step, a second centrifugal precipitation step, and a curing step.

Each step will be specifically described below.

(Base Body Preparation Step)

In the base body preparation step, base bodies having concave portions are prepared.

Figure 1:
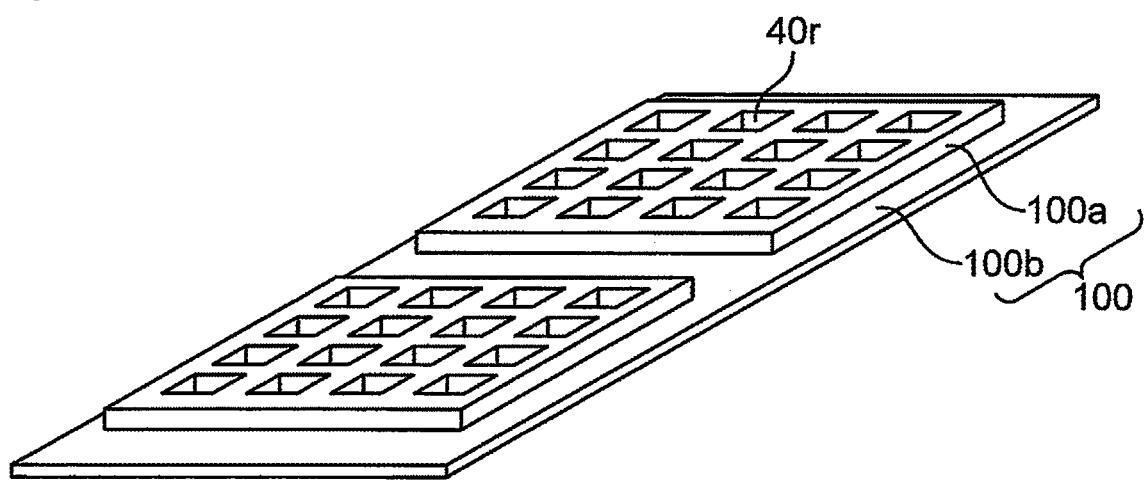
FIG. 1 is a perspective view of a lead frame molded body with base bodies arranged in an assembled state, which is prepared by a method of manufacturing a light emitting device according to a first embodiment of the present disclosure.
Figure 2:
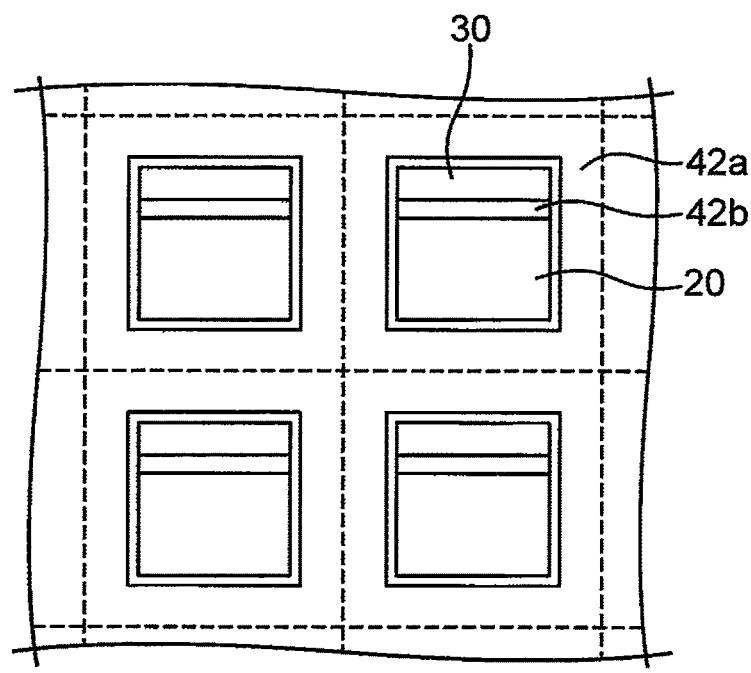
FIG. 2 is an enlarged plan view of a part of the lead frame molded body with the base bodies arranged in the assembled state, which is prepared by the method of manufacturing a light emitting device according to the first embodiment.
Figure 3:
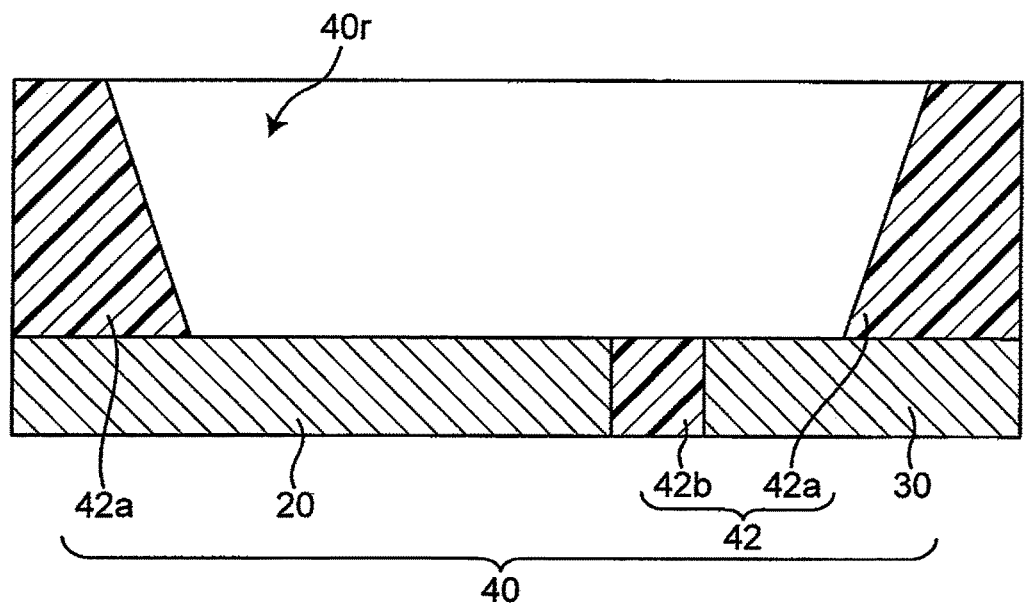
FIG. 3 is a cross-sectional view of the prepared base body in the method of manufacturing a light emitting device according to the first embodiment of the present disclosure.

Here, for example, as shown in FIG. 1, each base body (or a lead frame molded body 100) is prepared which includes a plurality of packages each having a concave portion 40r. Specifically, first, as shown in FIG. 2, in a unit region that serves as a package after singulation, a lead frame 100b is prepared to have separated first lead 20 and second lead 30. Then, while the first lead 20 and the second lead 30 in each unit region are supported by the prepared lead frame 100b and placed at respective predetermined positions within a cavity of a resin molding die, a molding resin is injected into this cavity and then cured. In the ways mentioned above, the lead frame molded body 100 is prepared which includes a molded resin portion 100a where molded resin portions 42 located in the respective unit regions are integrally formed. In the lead frame molded body 100, for example, as shown in FIG. 2, the molded resin portion 42 includes a first molded resin portion 42a molded to form the concave portion 40r above the first lead 20 and the second lead 30, and a second molded resin portion 42b separately supporting the first lead 20 and the second lead 30 in an insulated state. As shown in FIG. 3, the bottom surface of the concave portion 40r of the package 40 formed in each unit region includes a part of the upper surface of the first lead 20, a part of the upper surface of the second lead 30, and the upper surface of the second molded resin portion 42b. Alternatively or additionally, to more firmly support the first lead 20 and the second lead 30 by the molded resin portion 42, for example, through holes may be formed in parts of the first lead 20 and second lead 30 that are located directly under the first molded resin portion 42a, and a molding resin may be injected into the through holes.

It is noted that the base body in the base body preparation step may be prepared, for example, by purchasing a base body product in advance, instead of being manufactured and prepared in the above-mentioned manufacturing step.

(Disposition Step)

Here, the light emitting element 10 is disposed at the bottom surface of the concave portion in each unit region.

It is noted that the steps before the singulation will be described below with reference to the enlarged views of one package, but in practice these steps may be performed using the lead frame molded body 100 with a plurality of packages arranged therein in an assembled state.

Figure 4:
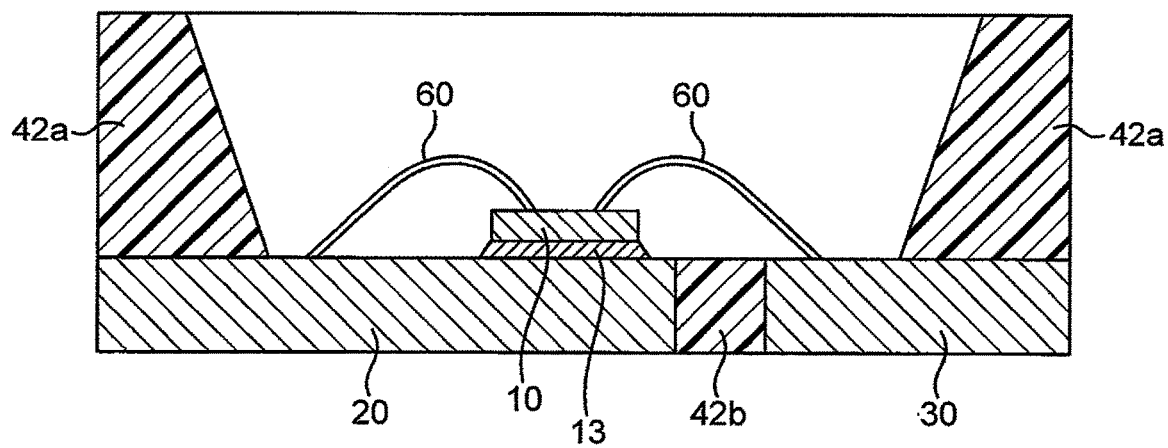
FIG. 4 is a cross-sectional view showing a light emitting element disposed at the bottom surface of a concave portion of the base body in the method of manufacturing a light emitting device according to the first embodiment.

The light emitting element 10 has, for example, positive and negative electrodes (not shown) on the light-emitting surface side. As shown in FIG. 4, in each unit region, the light emitting element 10 is die-bonded to the upper surface of the first lead 20 exposed at the bottom surface of the concave portion 40r, with the positive and negative electrodes connected to the first lead 20 and the second lead 30, respectively, by wires 60.

For example, a silicone resin or an epoxy resin may be used as a base material of a joint member 13 for die-bonding the light emitting element 10.

(First Resin Disposing Step)

Figure 5:
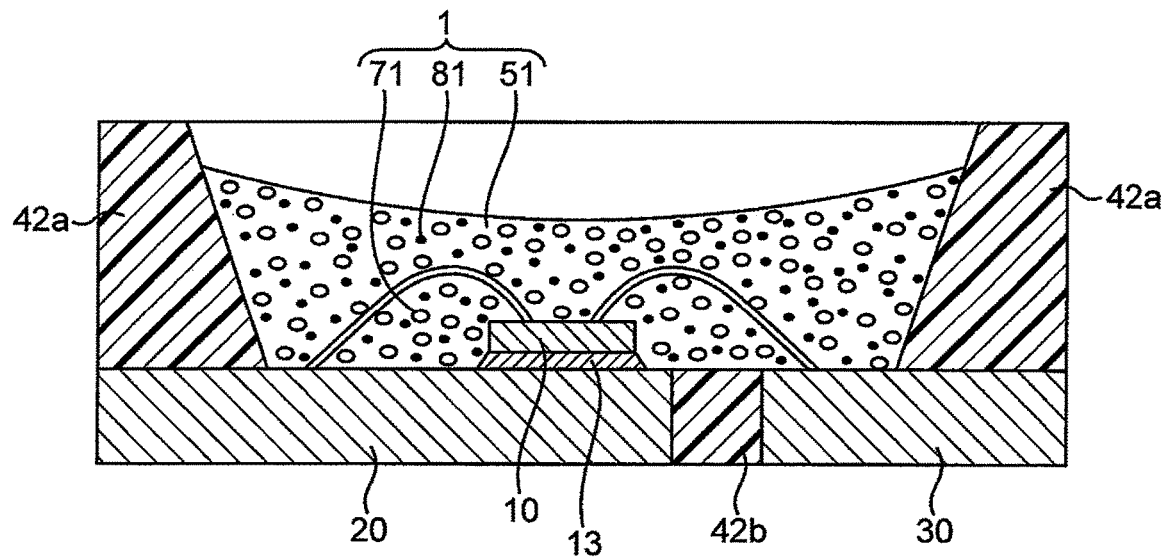
FIG. 5 is a cross-sectional view showing the state of a first resin layer obtained immediately after disposing a first resin with first phosphor particles and a first filler dispersed therein, within a concave portion in the method of manufacturing a light emitting device according to the first embodiment.

Here, a predetermined amount of a first resin 51 with first phosphor particles 71 and a first filler 81 dispersed therein is discharged and applied, for example, from a dispenser or the like, to be disposed within the concave portion 40r in each unit region. Consequently, a first resin layer 1 is formed to cover the light emitting element. As shown in FIG. 5, the first phosphor particles 71 and the first filler 81 are substantially uniformly dispersed in the first resin layer 1 obtained immediately after being disposed. Here, the particle sizes of the first phosphor particles 71 and the first filler 81 which are dispersed in the first resin 51 may be set to achieve a desired dispersion state by centrifugal precipitation to be mentioned later. Specifically, an average particle size of the first phosphor particle 71 is set in a range of 1 μm or more and 40 μm or less, and preferably 10 μm or more and 30 μm or less. An average particle size of the first filler is set in a range of 5 μm or more and 20 μm or less, and preferably 8 μm or more and 15 μm or less. The average particle size of the first filler is preferably set smaller than the average particle size of the first phosphor particle 71 within the above-mentioned range.

The content of the first phosphor particles 71 with respect to the first resin 51 (100 parts by weight) may be set in a range of, for example, 23 parts by weight or more and 64 parts by weight or less. The content of the first filler 81 with respect to the first resin 51 (100 parts by weight) may be set in a range of, for example, 9 parts by weight or more and 23 parts by weight or less. By setting the content of the first filler in this range, the possibility of occurrence of cracks in the first resin 51 after curing may be reduced while suppressing disconnection of the wire.

The specific gravity of the first phosphor particle 71 is 3 or more and 8 or less, while the specific gravity of the first filler 81 is 1 or more and 3.5 or less.

The amount of the first resin 51 with respect to the volume of the concave portion 40r is, for example, 10% to 90%, and preferably 50% to 70%.

The viscosity of the first resin 51 at the time of disposition of the first resin 51, in which the first phosphor particles 71 and first filler 81 are dispersed, is adjusted by taking into consideration the average particle size and particle size distribution of the first phosphor particles 71, the specific gravity of the first phosphor particle 71, the average particle size and particle size distribution of the first filler, the specific gravity of the first filler 81, and the like, so that the first phosphor particles 71 and the first filler 81 are precipitated with the desired distribution by the first centrifugal precipitation to be mentioned later.

Here, in the present specification, the term "average particle size" refers to an average of particle diameters measured by the Fisher Sub-Sieve Sizer (FSSS) method. In the Fisher method, the average particle size is measured, for example, by Fisher Sub-Sieve Sizer Mode 195 (manufactured by Fisher Scientific Corporation).

As exemplified in the description of the disposition step, when the electrodes of the light emitting element 10 are connected to the first lead frame and the second lead frame by the wires, the first resin layer 1 is preferably formed to cover the entire wires 60 with the first resin 51 in the first resin disposing step. In this way, since the entire wires 60 are covered with one kind of resin, that is, not covered with two or more kinds of resins having different thermal expansion coefficients, the wires 60 are not under excessive stress due to changes in the temperature of the resin, thus making it possible to enhance the reliability of the light emitting device. The first resin 51 may not completely contain the light emitting element 10 and may cover only a part of the light emitting element 10.

(First Centrifugal Precipitation Step)

Figure 6:
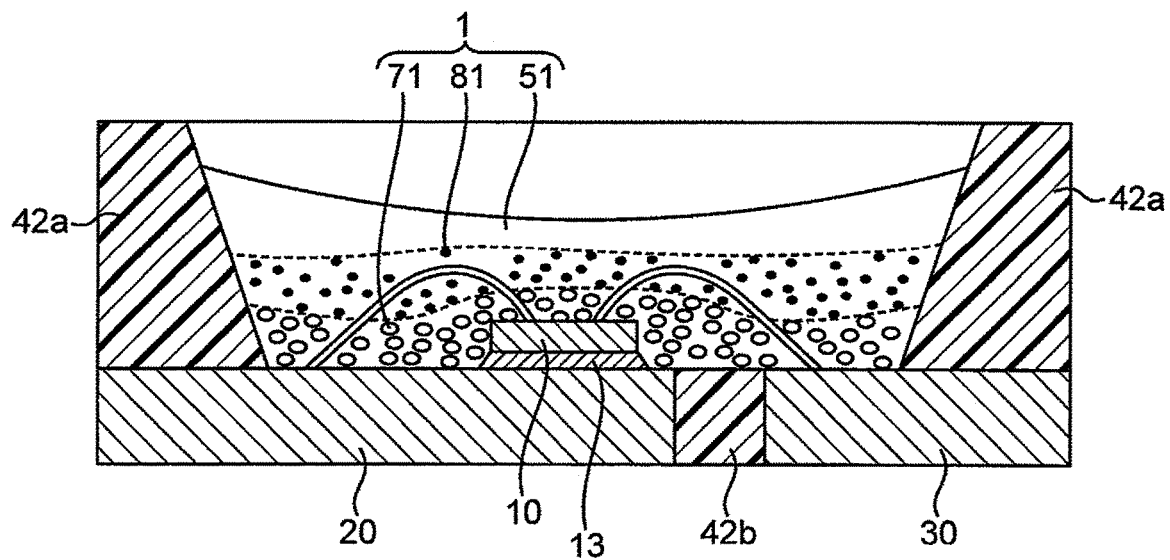
FIG. 6 is a cross-sectional view showing the internal state of the first resin layer after centrifugally precipitating the first phosphor particles and the first filler in the disposed first resin layer in the method of manufacturing a light emitting device according to the first embodiment.

After forming the first resin layer 1, the first phosphor particles 71 and the first filler 81 dispersed in the first resin 51 are centrifugally precipitated while the first resin 51 is in an uncured state. The first phosphor particles 71 and the first filler 81 are unevenly distributed by the centrifugal precipitation in the first resin 51 so as to have their distribution densities increased on the bottom surface side of the concave portion 40r. When the first filler having the average particle size smaller than the average particle size of the first phosphor particle 71 is dispersed in the first resin 51, as schematically shown in FIG. 6, a first phosphor layer, a first filler layer, and a first resin upper layer are formed in the first resin layer 1. In the first phosphor layer, the distribution density of the first phosphor particles is higher than the distribution density of the first filler on the bottom surface side of the concave portion 40r. In the first filler layer, located above the first phosphor layer, the distribution density of the first filler is higher than the distribution density of the first phosphor particles. In the first resin upper layer, both the distribution densities of the first filler and first phosphor particles are small. Regarding the distribution density of the first phosphor particles 71 in the first resin layer 1, for example, the number of the first phosphor particles 71 in a region from the lower surface of the first resin layer 1 to half (½) of the height of the first resin layer 1 is larger than the number of the first phosphor particles 71 in a region from the half (½) of the height of the first resin layer 1 to the upper surface of the first resin layer 1, on one cross section of the first resin layer 1 in the direction perpendicular to the upper surfaces of the first lead 20 and the second lead 30. It is noted that a region directly above the light emitting element 10 is excluded from the above-mentioned regions.

In the centrifugal precipitation step, for example, the lead frame molded body 100 with each concave portion 40r in the unit region filled with the first resin 51 is housed in a magazine and rotated by a centrifuge until the first phosphor particles 71 and the first filler 81 are sufficiently precipitated. Consequently, the first phosphor particles 71 and the first filler 81 are centrifugally precipitated. In the centrifugal precipitation step, the extent of centrifugal precipitation can be adjusted by setting the rotation speed and time of the centrifuge. In the present embodiment, for example, the centrifugal precipitation step is performed at the rotation speed of 300 rpm (rotations per minute) for 30 minutes.

(Temporary Curing Step)

Then, the first resin disposed in the concave portions 40r is temporarily cured. The temporary curing at this time is conducted, for example, to the extent that can maintain the shape of the first resin layer in the subsequent second resin disposing step and second centrifugal precipitation step. By such a temporary curing, the shape of the first resin layer can be maintained, and additionally, the subsequent steps can be carried out without substantially changing the dispersion state of the first phosphor particles 71 and first filler 81 in the first resin layer 1.

(Second Resin Disposing Step)

Figure 7:
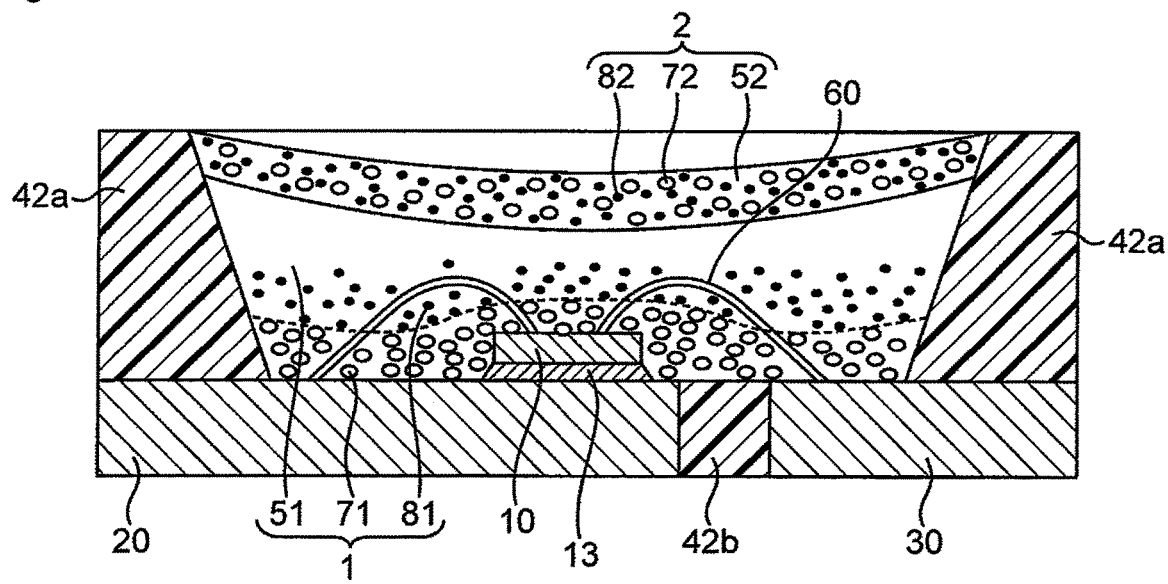
FIG. 7 is a cross-sectional view showing the state of a second resin layer obtained immediately after disposing a second resin with second phosphor particles and a second filler dispersed therein, within the concave portion in the method of manufacturing a light emitting device according to the first embodiment.
Figure 8:
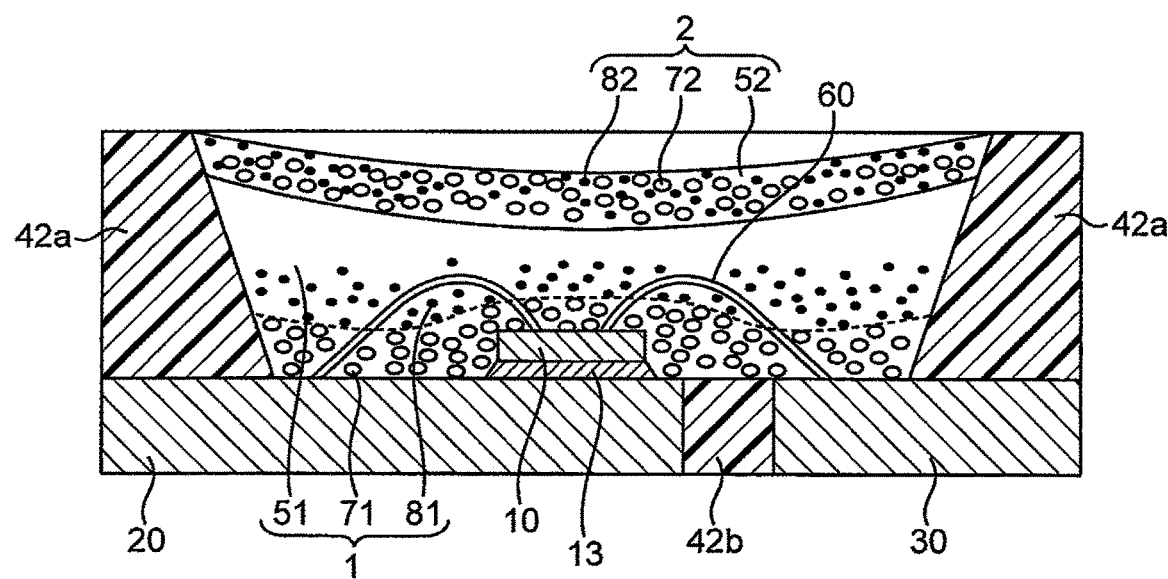
FIG. 8 is a cross-sectional view showing the state of the second resin layer after centrifugally precipitating the second phosphor particles and the second filler in the disposed second resin layer in the method of manufacturing a light emitting device according to the first embodiment.

Here, a second resin 52 that contains second phosphor particles and a second filler having an average particle size of 5 nm or more and 100 nm or less, which particles and filler are dispersed in the second resin, is discharged and applied, for example, from a dispenser or the like, to thereby form a second resin layer 2 on the first resin layer 1 temporarily cured in the concave portion 40r in each unit region. As shown in FIG. 7, the second phosphor particles 72 and the second filler 82 are substantially uniformly dispersed in the second resin layer 2 obtained immediately after being disposed. Here, the particle size of the second phosphor particles 72 and the particle size of the second filler 82 which are dispersed in the second resin 52 are set to achieve a desired dispersion state by centrifugal precipitation to be mentioned later. However, it is important that the average particle size of the second filler 82 is 5 nm or more and 100 nm or less. By setting the average particle size of the second filler 82 at 5 nm or more and 100 nm or less, the dispersion effect of the second phosphor particles in the second resin layer may be improved, thus completely suppressing the precipitation of the second phosphor particles into the layer below the second resin layer 2. This makes it easy to separate the second phosphor particles away from the light emitting element, and thus may effectively suppress degradation of the second phosphor particles due to the light and the like. The average particle size of the second phosphor particle 72 is set in a range of 1 μm or more and 40 μm or less, and preferably 5 μm or more and 15 μm or less. The average particle size of the second filler 82 is set more preferably in a range of 5 nm or more and 15 nm or less.

The content of the second phosphor particles 72 with respect to the second resin 52 (100 parts by weight) is set in a range of, for example, 17 parts by weight or more and 47 parts by weight or less, while the content of the second filler 82 with respect to the second resin 52 (100 parts by weight) is set in a range of, for example, 0.1 part by weight or more and 2 parts by weight or less.

The specific gravity of the second phosphor particle 72 is 1 or more and 5 or less, and preferably 2 or more and 4.5 or less. The specific gravity of the second filler 82 is 1 or more and 5 or less, and preferably 2 or more and 3 or less.

The amount of the second resin 52 with respect to the volume of the concave portion 40r is, for example, 10% to 90%, and preferably 30% to 50%. The amount of the second resin 52 with respect to the amount of the first resin 51 is, for example, 40% to 100%.

Like the first resin 51 in the first resin disposing step, the viscosity of the second resin 52 at the time of disposition of the second resin 52, in which the second phosphor particles 72 and second filler 82 are dispersed, is adjusted by taking into consideration the average particle size and particle size distribution of the second phosphor particles 72, the specific gravity of the second phosphor particle 72, the average particle size and particle size distribution of the second filler 82, the specific gravity of the second filler 82, and the like, so that the second phosphor particles 72 and the second filler 82 are precipitated with the desired distribution by the second centrifugal precipitation to be mentioned later. Here, a measurement method of the average particle size and a measurement method of the particle size distribution are the same as those of the first phosphor particles 71 and the first filler 81.

(Second Centrifugal Precipitation Step)

After forming the second resin layer 2 in the concave portion 40r of each unit region, the second phosphor particles 72 and the second filler 82 dispersed in the second resin 52 are centrifugally precipitated while the second resin 52 is in an uncured state. The second phosphor particles 72 are unevenly distributed by the centrifugal precipitation in the second resin 52 so as to have their distribution densities increased on the first resin layer 1 side within the concave portion 40r, while the second filler 82 is disposed between and around the second phosphor particles 72. The second filler 82 is disposed while being more dispersed in the second resin layer 2 than the first filler 81 in the first resin layer.

In the second centrifugal precipitation step, the same centrifuge as in the first centrifugal precipitation step may be used. At this time, in the second centrifugal precipitation step, the rotation speed and time of the centrifuge may be the same as or different from the rotation speed and time thereof in the first centrifugal precipitation step. Preferably, the rotation speed in the second centrifugal precipitation step is smaller than the rotation speed in the first centrifugal precipitation step, or the time of the second centrifugal precipitation step is shorter than the time of the first centrifugal precipitation step. Thus, the second phosphor particles 72 may be dispersively disposed in the second resin layer 2 without being completely precipitated there.

The distribution of the first phosphor particles 71 in the first resin layer 1 and the distribution of the second phosphor particles 72 in the second resin layer 2 are characterized on one cross section of the first resin layer 1 and the second resin layer 2 in the direction perpendicular to the upper surfaces of the first lead 20 and the second lead 30. Specifically, the distribution of the second phosphor particles 72 positioned in an upper region of the second resin layer 2 from half (½) of the height of the second resin layer 2 is larger than the distribution of the first phosphor particles 71 positioned in an upper region of the first resin layer 1 from the half (½) of the height of the first resin layer 1.

(Curing Step)

Then, the first resin 51 and the second resin 52 are cured.

Here, the first resin 51 and the second resin 52 are cured while maintaining the distribution state of the first phosphor particles 71 and first filler 81 in the first resin layer 1 obtained after the first centrifugal precipitation step, as well as the distribution state of the second phosphor particles 72 and second filler 82 in the second resin layer 2 obtained after the second centrifugal precipitation step.

(Singulation Step)

Finally, a wafer including the base bodies is singulated into the packages 40 in the respective unit regions.

Through the above-mentioned steps, the light emitting device of the first embodiment is produced.

According to the light emitting device produced by the manufacturing method configured as mentioned above, variations in the distribution of the first phosphor particles 71 and the first filler 81 in the first resin layer 1, as well as variations in the distribution of the second phosphor particles 72 and second filler 82 in the second resin layer 2 can be reduced among produced light emitting devices. Thus, the light emitting devices with small variations in the emission color can be manufactured.

That is, the method of manufacturing a light emitting device of the first embodiment includes the first centrifugal precipitation step after the first resin disposing step, so that by appropriately setting the conditions for centrifugal precipitation in the first centrifugal precipitation step, the first phosphor particles 71 and the first filler 81 can be precipitated so as to be consistently located across designated areas with the desired distribution. The distribution state of the first phosphor particles 71 and first filler 81 after the first centrifugal precipitation step is not substantially changed by an external force applied in the following steps. For example, if the particles or fillers are precipitated by natural precipitation, the precipitation may proceed over an elapsed time, which could cause variations in the distribution of the particles or filler due to the change in the distribution state thereof, depending on the length of the elapsed time. In contrast, when the particles or filler are centrifugally precipitated, natural precipitation hardly occurs after the centrifugal precipitation. In addition, the method of manufacturing a light emitting device of the first embodiment includes the temporary curing step after the first centrifugal precipitation step, so that the distribution state of the first phosphor particles 71 and the first filler 81 can be maintained more firmly after the first centrifugal precipitation step.

The method of manufacturing a light emitting device of the first embodiment includes the second centrifugal precipitation step after the second resin disposing step, so that by optimizing the conditions for centrifugal precipitation in the second centrifugal precipitation step, the second phosphor particles 72 and the second filler 82 can be precipitated to be consistently located across designated areas with the desired distribution. As mentioned in the description of the first centrifugal precipitation step, the distribution state of the second phosphor particles 72 and second filler 82 after the second centrifugal precipitation step is not substantially changed by an external force applied thereto in the following steps. In addition, the method of manufacturing a light emitting device of the first embodiment includes the curing step after the second centrifugal precipitation step, so that the distribution state of the second phosphor particles 72 and the second filler 82 can be maintained more firmly after the second centrifugal precipitation step.

Therefore, the method of manufacturing a light emitting device in the first embodiment can reduce variations in the distribution state of the phosphor particles in each phosphor layer among produced light emitting devices, and thus can manufacture the light emitting devices with small variations in the emission color.

In the light emitting device of the first embodiment produced as mentioned above, the first phosphor particles 71 and the second phosphor particles 72 are unevenly distributed in the first phosphor layer 1 and the second phosphor layer 2, respectively, so as to have their distribution densities increased on the bottom surface side of the concave portion 40 in their respective resin layers. Thus, for example, the phosphors having low moisture resistance can be distant from an opening of the concave portion.

The first phosphor particles 71 are unevenly distributed in the first phosphor layer 1 so as to be located mostly on the bottom surface side of the concave portion 40. In addition to this, in the light emitting device of the first embodiment, the first filler 81 is unevenly distributed in one region of the first phosphor layer 1, excluding another region thereof where the first phosphor particles 71 unevenly distributed are located mostly (hereinafter referred to as an uneven distribution region), so that the first filler 81 is located mostly at the uneven distribution region side of the one region. Thus, for example, the resistance to thermal shock around the wire of the light emitting device can be improved, thereby preventing disconnection of the wire.

In the light emitting device of the first embodiment, the second phosphor particles 72 are unevenly distributed in the second phosphor layer 2 so as to be located most on the first phosphor particles 71 side. This can effectively keep a phosphor away from moisture contained in the outside air, for example, in the case of using the phosphor having low moisture resistance.

In addition to the second phosphor particles 72 being unevenly distributed in the second phosphor layer 2 so as to be located mostly on the first phosphor layer 1 side, the light emitting device of the first embodiment is configured such that the second filler 82 is distributed to be disposed between adjacent phosphor particles. This can prevent the second phosphor particles from completely precipitating inside the second phosphor layer 2, so that the second phosphor particles 72 can be dispersively disposed in the second phosphor layer 2.

Second Embodiment

Figure 9:
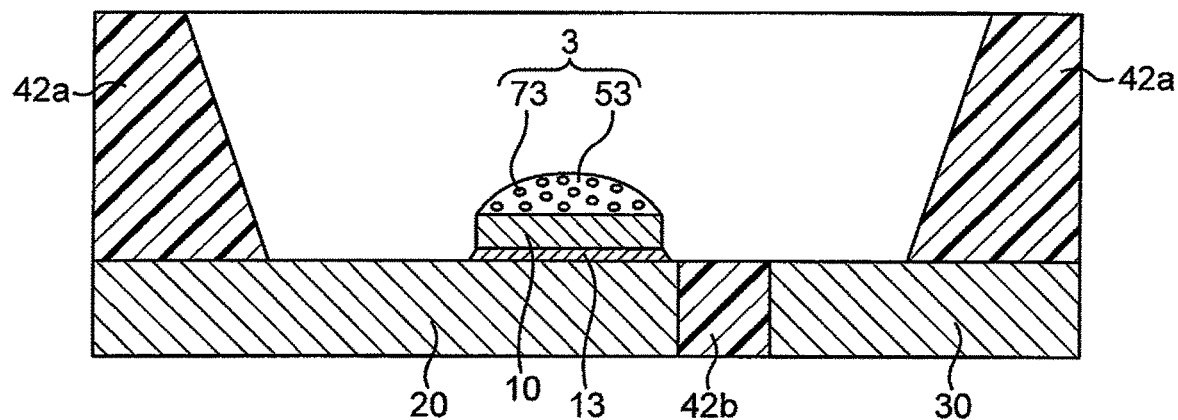
FIG. 9 is a cross-sectional view showing the disposition of a third resin with third phosphor particles dispersed therein, on a light-emitting surface of the light emitting element in a method of manufacturing a light emitting device according to a second embodiment of the present disclosure.
Figure 10:
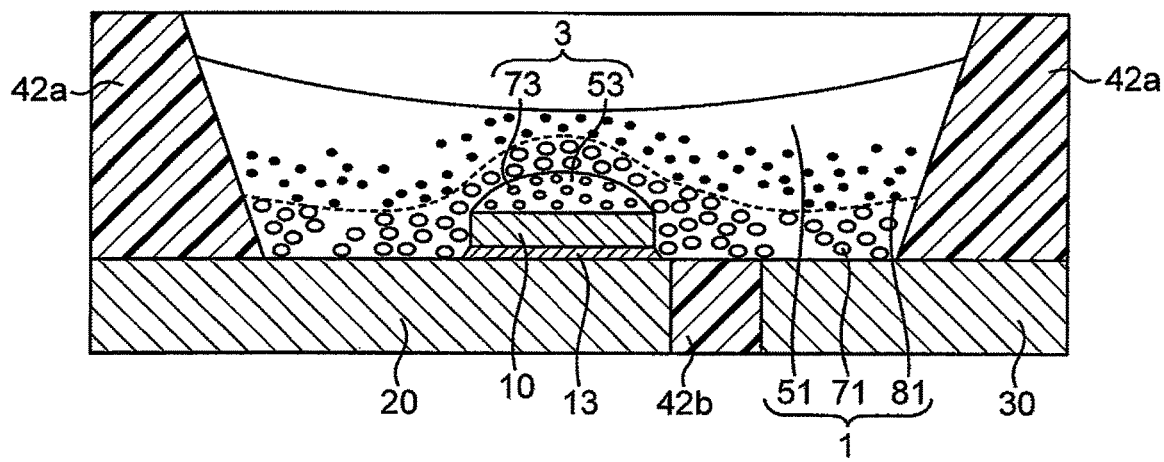
FIG. 10 is a cross-sectional view showing the internal state of the first resin layer after disposing, within the concave portion, the first resin with the first phosphor particles and first filler dispersed therein, and centrifugally precipitating the first phosphor particles and the first filler in the method of manufacturing a light emitting device according to the second embodiment.
Figure 11:
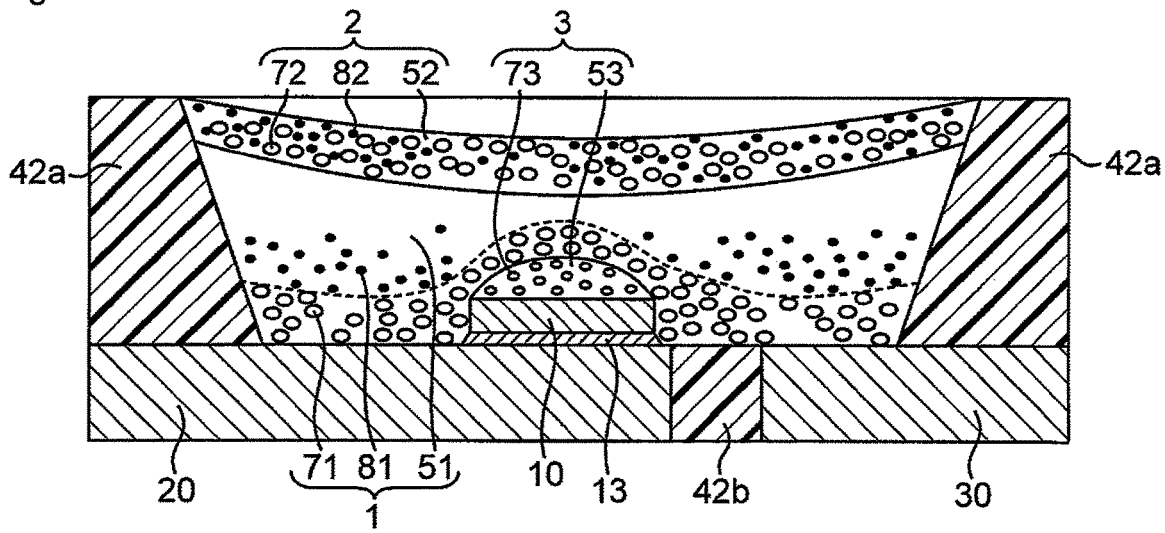
FIG. 11 is a cross-sectional view showing the internal state of the second resin layer after disposing, within the concave portion, the second resin with the second phosphor particles and second filler dispersed therein, and centrifugally precipitating the second phosphor particles and the second filler in the method of manufacturing a light emitting device according to the second embodiment.

As shown in FIGS. 9 to 11, a light emitting device of a second embodiment has the same configuration as the light emitting device of the first embodiment except that a third phosphor layer 3 containing third phosphor particles 73 is formed on a light-emitting surface of the light emitting element 10. For example, the third phosphor layer 3 is made of a third resin in which the third phosphor particles 73 are dispersed. The third phosphor layer 3 has its upper surface formed in a convex curved shape.

In the light emitting device of the second embodiment configured as mentioned above, for example, three kinds of phosphor particles can be separately dispersed in three layers for each phosphor particle. Here, for example, by disposing the layers of the three kinds of phosphor particles in order of decreasing the wavelength of the phosphor particle from the light-emitting surface of the light emitting element, the absorption of light between the phosphors may be suppressed, achieving the light emitting device with better light extraction.

The method of manufacturing a light emitting device of the second embodiment has the same configuration as that in the first embodiment except that the method includes a step of forming the third phosphor layer 3 containing the third phosphor particles 73, on the light-emitting surface of the light emitting element 10. The step of forming the third phosphor layer 3 may be performed between the disposing step of disposing the light emitting element 10 and the first resin disposing step of disposing the first resin, or may be performed between the first resin disposing step and the second resin disposing step.

Hereinafter, a description will be given specifically on the step of forming the third phosphor layer 3 (third phosphor layer formation step), which step is added to the method of manufacturing a light emitting device of the first embodiment.

The third phosphor layer formation step may include a third resin disposing step and a temporary curing step, and may also include a third precipitation step between the third resin disposing step and the temporary curing step as necessary.

(Third Resin Disposing Step)

Here, as shown in FIG. 9, the third resin 53 with the third phosphor particles 73 dispersed therein is discharged and applied from a dispenser to be disposed on the light-emitting surface of the light emitting element 10. It is noted that in addition to the third phosphor particles 73, a third filler may be further dispersed in the third resin 53. The third resin 53 is preferably formed by utilizing the surface tension of the third resin 53 such that an outer peripheral end of the light-emitting surface of the light emitting element 10 coincides with an outer peripheral end (lower end) of the disposed third resin 53, and that the upper surface of the third resin 53 has a curved surface with a desired curvature. That is, when preparing the third resin 53, the wettability, viscosity, and the like of the third resin 53 are adjusted such that the outer peripheral end (lower end) of the third resin 53 after the disposition coincides with the outer peripheral end of the light-emitting surface, and that the upper surface of the disposed third resin 53 has a desired curvature, in other words, that a contact angle of the third resin 53 at the outer peripheral end of the light emitting surface becomes a predetermined value. In this way, the third resin layer 3 is provided only on the upper surface of the light emitting element 10 by using the surface tension of the third resin 53, which can stably form the third resin layers 3 with small variations in shape among produced light emitting devices. The outer peripheral end of the light-emitting surface of the light emitting element 10 does not necessarily coincide with the outer peripheral end (lower end) of the disposed third resin 53.

As mentioned above, in the third resin disposing step, the third resin 53 is formed using the surface tension of the third resin 53 not so as to cover the side surface of the light emitting element 10 such that the outer peripheral end of the light-emitting surface of the light emitting element 10 coincides with the outer peripheral end (lower end) of the disposed third resin 53. Thus, the first resin layer 1 can be irradiated directly with light emitted from the side surface of the light emitting element 10, so that the first phosphor particles 71 contained in the first resin layer 1 may be efficiently excited.

When the third phosphor particles 73 and a third filler 83 are contained in the third resin layer 3 obtained immediately after being disposed, the third phosphor particles 73 and the third filler 83 are dispersed in the third resin 53. The particle size of the third phosphor particle 73 dispersed in the third resin 53 is set, for example, in a range of 1 µm or more and 40 µm or less, and preferably 10 µm or more and 18 µm or less.

(Third Precipitation Step)

It is optional whether or not the third precipitation step is performed. Here, the third phosphor particles 73 are precipitated as necessary. In the third precipitation step, the third phosphor particles 73 are precipitated, for example, by natural precipitation, in order to maintain the shape of the third resin layer 3. The third phosphor particles 73 may be centrifugally precipitated. When the third phosphor particles 73 are centrifugally precipitated, the conditions for the centrifugal precipitation are set not to change the shape of the third resin layer 3. When the third filler 83 is dispersed in the third resin layer 3, the third filler 83 may be precipitated together with the third phosphor particles 73. For example, the third filler 83 that has a particle size smaller than the third phosphor particle 73 is used to delay the precipitation of the third filler 83 or not to substantially precipitate the third filler 83.

(Curing Step)

Then, the third resin 53 disposed on the light-emitting surface of the light emitting element 10 is cured. Here, the curing may be performed temporarily or fully as long as the shape of the third resin layer 3 and the dispersion state of the third phosphor particles 73 can be maintained in the subsequent steps.

After this curing step of the third resin, the light emitting device of the second embodiment is produced through the first resin disposing step, the centrifugal precipitation step, the temporary curing step, the second resin disposing step, the second centrifugal precipitation step, and another curing step, in the same manner as in the first embodiment.

In the first resin disposing step performed after the curing step of curing the third resin 53, the first resin layer 1 is provided to cover the third resin layer 3.

A phosphor particle that emits light having a wavelength longer than that of the first phosphor particle 71 is preferably used as the third phosphor particle 73, whereby the absorption of light emitted from the third phosphor particles 73 by the first phosphor particles 71 can be suppressed.

Furthermore, a phosphor particle that emits light having a wavelength longer than each of the wavelengths of the first phosphor particle 71 and the second phosphor particle 72 is preferably used as the third phosphor particle 73, whereby the absorption of light emitted from the third phosphor particles 73 by the first phosphor particles 71 and the second phosphor particles 72 may be suppressed. The first resin layer 1 may not completely contain the third resin layer 3, but may cover only a part of the third resin layer 3.

In the light emitting device of the second embodiment produced as mentioned above, for example, particles made of a phosphor having an emission peak at a long wavelength (for example, a SCASN phosphor, a KSF phosphor, or an MGF phosphor (red) mentioned later) are selected as the third phosphor particles and may be provided in the vicinity of the light-emitting surface of the light emitting element 10. Further, particles made of a short-wavelength phosphor having an emission peak at a shorter wavelength than the long-wavelength phosphor (for example, a YAG phosphor (yellow) mentioned later) are selected as the first or second phosphor particles and may be disposed on the outer side of the long-wavelength phosphor. In this way, the absorption of light between the phosphors may be suppressed, enhancing the light emission efficiency.

Hereinafter, a description will be given on the first to third phosphor particles, the first to third resins, the light emitting element, and the like in the light emitting devices of the first and second embodiments.

(First to Third Phosphor Particles)

The first to third phosphor particles, which are dispersed in the first to third resin layers 1, 2, and 3, respectively, are not particularly limited in use, but may be selected from particles composed of the following phosphors, for example.

It is noted that the first to third phosphor particles may include particles composed of two or more kinds of phosphors. For example, particles of two or more kinds of the following phosphors may be selected and used.

(1) Green-light emitting phosphor that contains an alkaline earth aluminate activated by Eu For example, the alkaline earth aluminate has a composition preferably represented by the formula (1a) below and more preferably the formula (1a') below.

$(Sr,Ca,Ba)_4Al_{14}O_{25}:Eu$        (1a)

$Sr_4Al_{14}O_{25}:Eu$        (1a')

The emission peak wavelength of the green-light emitting phosphor that contains an alkaline earth aluminate activated by Eu can be set in a range of, for example, 400 nm or more and 550 nm or less by adjusting its composition as appropriate.

(2) Green-light emitting phosphor that contains a silicate activated by Eu and having a composition including Ca, Mg, and Cl For example, the silicate has a composition preferably represented by the formula (1b) below, and more preferably the formula (1b') below.

$(Ca,Sr,Ba)_8MgSi_4O_{16}(F,Cl,Br)_2:Eu$        (1b)

$Ca_8MgSi_4O_{16}Cl_2:Eu$        (1b')

The emission peak wavelength of the green-light emitting phosphor that contains the silicate activated by Eu and having the composition including Ca, Mg, and Cl can be set in a range of, for example, 510 nm or more and 540 nm or less by adjusting the composition as appropriate.

(3) Yellow-light emitting phosphor that contains a rare earth aluminate activated by Ce For example, the rare earth aluminate activated by Ce has a composition preferably represented by the formula (1c) below and more preferably the formula (1c') below.

$(Y,Lu,Gd)_3(Al,Ga)_5O_{12}:Ce$        (1c)

$Y_3Al_5O_{12}:Ce$        (1c')

The emission peak wavelength of the yellow-light emitting phosphor that contains the rare earth aluminate activated by Ce can be set in a range of, for example, 480 nm or more and 630 nm or less by adjusting its composition as appropriate.

(4) Red-light emitting phosphor that contains a silicon nitride activated by Eu and having a composition including Al and at least one of Sr and Ca For example, the silicon nitride activated by Eu and having a composition including Al and at least one of Sr and Ca has the composition represented by the formula (1d) below.

$(Sr,Ca)AlSiN_3:Eu$        (1d)

The silicon nitride having the composition represented by the formula (1d) may contain at least one element selected from the group consisting of Sr and Ca, and preferably contains both Sr and Ca.

The emission peak wavelength of the silicon nitride activated by Eu and having the composition including Al and at least one of Sr and Ca can be set in a range of, for example, 620 nm or more and 650 nm or less by adjusting the composition as appropriate.

(5) Deep-red-light emitting phosphor (MGF phosphor) that contains a fluorogermanate activated by Mn For example, the fluorogermanate preferably has a composition represented by the formula (1e) or (1e') below.

$3.5MgO \cdot 0.5MgF_2 \cdot GeO_2:Mn$        (1e)

$(x-s)MgO \cdot (s/2)Sc_2O_3 \cdot yMgF_2 \cdot uCaF_2 \cdot (1-t)GeO_2 \cdot (t/2)M^r_2O_3:zMn$        (1e')

In the formula (1e), x, y, z, s, t, and u preferably satisfy $2.0 \leq x \leq 4.0$, $0 < y < 1.5$, $0 < z < 0.05$, $0 \leq s < 0.5$, $0 < t < 0.5$, $0 \leq u < 1.5$, and $y+u < 1.5$. Where $M^r$ in the above-mentioned general formula (1e) is at least one selected from the group consisting of Al, Ga, and In.

The emission peak wavelength of the dark-red-light emitting phosphor (MGF phosphor) containing the fluorogermanate activated by Mn can be set in a range of, for example, 650 nm or more and 670 nm or less by adjusting its composition as appropriate.

(6) Blue-light emitting phosphor that contains an alkaline earth phosphate activated by Eu and having a composition including Cl
(CCA Phosphor)

For example, the blue-light emitting phosphor (CCA phosphor) that contains an alkaline earth phosphate activated by Eu and having a composition including Cl has the composition preferably represented by the formula (1f) below and more preferably the formula (1f') below.

$$(Ca,Sr,Ba)_5(PO_4)_3(Cl,Br):Eu \quad (1f)$$

$$Ca_5(PO_4)3Cl:Eu \quad (1f')$$

The emission peak wavelength of the blue-light emitting phosphor (CCA phosphor) that contains the alkaline earth phosphate activated by Eu and containing Cl may be set in a range of, for example, 430 nm or more and 500 nm or less by adjusting its composition as appropriate.

(7) Other phosphors
Examples of other phosphors may include:
$Ca_3Sc_2Si_3O_{12}$:Ce,
$CaSc_2O_4$:Ce,
$(La, Y)_3Si_6N_{11}$:Ce,
$(Ca, Sr, Ba)_3Si_6O_9N_4$:Eu,
$(Ca, Sr, Ba)_3Si_6O_{12}N_2$:Eu,
$(Ba, Sr, Ca)Si_2O_2N_2$:Eu,
$(Ca,Sr,Ba)_2Si_5N_8$:Eu,
$(Ca,Sr,Ba)S$:Eu,
$(Ba,Sr,Ca)Ga_2S_4$:Eu,
$K_2(Si,Ti,Ge)F_6$:Mn, and the like.

The first to third phosphor particles are appropriately selected from, for example, the above-listed phosphors by considering the required color rendering properties of the light emitting device. It is preferably determined which one of the first, second, and third phosphor layers 1, 2, and 3 has the selected phosphor particles dispersed therein by considering the deterioration of each phosphor due to light and moisture. For example, in the case of using an MGF phosphor, which tends to be more deteriorated by moisture than other phosphors, phosphor particles contained in the MGF phosphor are dispersed in the first resin layer 1 or the third resin layer. In this way, the MGF phosphor can be covered with the first resin 51 and the second resin 52, thereby reducing the influence of moisture contained in an external environment on the MGF phosphor, so that the deterioration of the MGF phosphor may be suppressed. For example, in the case of using a CCA phosphor, which tends to be more deteriorated by light from the light emitting element 10 than other phosphors, phosphor particles contained in the CCA phosphor are dispersed in the second resin layer 2, located far from the light emitting element 10. In this way, the intensity of light with which the CCA phosphor is irradiated can be lowered, thereby suppressing the deterioration of the CCA phosphor by the light.

As mentioned above, the phosphor layer in which the phosphor is to be dispersed is selected depending on the properties of the phosphor, thus making it possible to provide the light emitting device of stable quality with less deterioration of the phosphor.

(First to Third Resins)
Examples of the first to third resins constituting the first to third resin layers, respectively, include a thermoplastic resin and a thermosetting resin. Specific examples of the thermosetting resin include an epoxy resin, a silicone resin, a modified silicone resin, such as an epoxy modified silicone resin, and the like.

(First to Third Fillers and the like)
For example, a filler made of silica, a barium titanate, a titanium oxide, an aluminum oxide, or the like may be used as the first to third fillers.

The first to third resin layers may also contain a light stabilizer, a colorant, and the like.

(Light Emitting Element 10)
The emission peak wavelength of the light emitting element 10 is set, for example, in a range of 440 nm or more and 460 nm or less. The emission peak wavelength thereof is preferably in a range of 445 nm or more and 455 nm or less in terms of the light emission efficiency. By using the light emitting element 10 having the emission peak wavelength in this range as an excitation light source, the phosphor listed above may be efficiently excited. In addition, white light may be emitted by mixing the light from the light emitting element 10 and fluorescence from the phosphor.

The full width at half maximum of the emission spectrum of the light emitting element 10 may be, for example, 30 nm or less. A semiconductor light emitting element, such as an LED, is preferably used as the light emitting element 10. The semiconductor light emitting element with high efficiency that exhibits high linearity of an output with respect to an input is preferably used as the light emitting element 10.

For example, a semiconductor light emitting element which emits blue light utilizing a nitride-based semiconductor ($In_xAl_yGa_{1-x-y}N$ where x and y satisfy the following: $0 \leq X, 0 \leq Y, X+Y \leq 1$) may be used. It is noted that the light emitting device may include at least one light emitting element 10 and also may include two or more light emitting elements. When the light emitting device includes two or more light emitting elements, these two light emitting elements may have different emission peak wavelengths.

Figure 12:
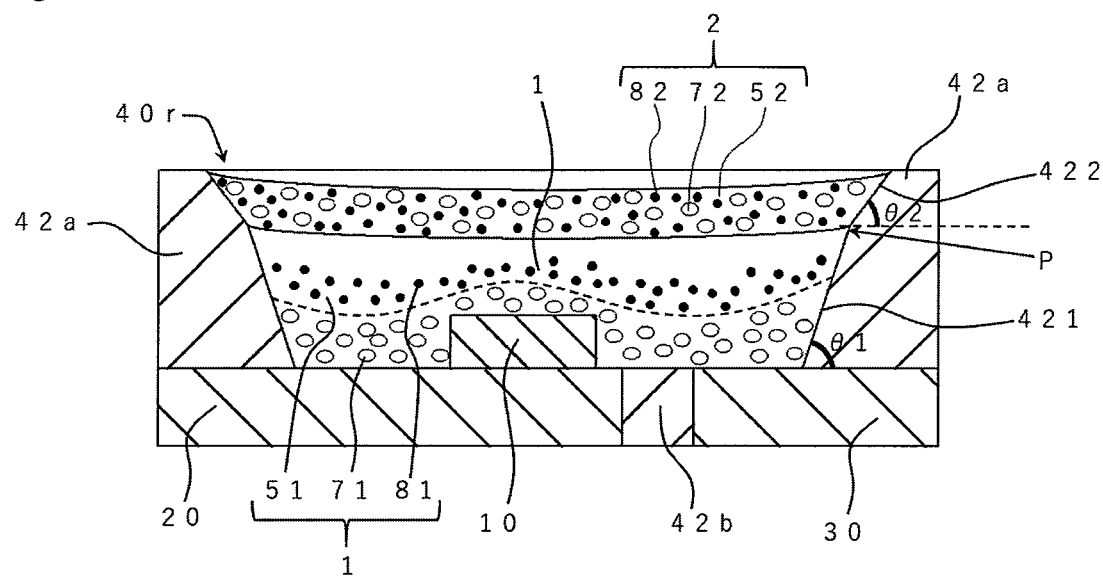
FIG. 12 is a cross-sectional view showing a modification of the light emitting device.

<Modification 1>
FIG. 12 shows a modification of the light emitting device. As shown in FIG. 12, in the light emitting device of the modification, the inner side surface of the first molded resin portion 42a has a first inclined portion 421 and a second inclined portion 422, on the cross section taken along the direction perpendicular to the upper surface of the first lead 20 while passing through the first lead 20 and the second lead 30. The first inclined portion 421 extends from the bottom surface of the concave portion 40r toward the opening. An angle formed between the first inclined portion 421 and the bottom surface of the concave portion 40r is referred to as θ1. The second inclined portion 422 extends from the upper end of the first inclined portion 421 toward the opening. An angle formed between the second inclined portion 422 and the bottom surface of the concave portion 40r is referred to as θ2. Here, θ1 is larger than θ2.

The first resin layer 1 is located at a height equal to or lower than the height of an inflection point P between the first inclined portion 421 and the second inclined portion 422. The first resin layer 1 is disposed in contact with the inflection point P. The second resin layer 2 is positioned above the first resin layer 1. The light emitting device has the first inclined portion 421 and the second inclined portion 422. The first resin layer 1 is disposed with reference to the inflection point P between the first and second inclined portions 421 and 422, which may easily make the application amount and shape of the first resin layer 1 uniform among the light emitting devices. That is, when the first resin layer 1 is disposed in the concave portion 40r by being applied thereto, the amount of resin and height of the first resin layer 1 are determined with reference to the height of the inflection point P. Thus, when manufacturing the plurality of light emitting devices, the amount of resin and shape of the first resin layer 1 in each light emitting device may be uniformized more, thereby effectively suppressing unevenness in the color among the produced light emitting devices.

It is noted that the side surface of the first molded resin portion 42a may include one or more inclined portions, as well as the first inclined portion 421 and the second inclined portion 422. Thus, for example, when the light emitting device includes three or more resin layers, each resin layer is disposed with reference to the inflection point of the corresponding inclined portion, thereby making it possible to effectively suppress the unevenness in the color among the produced light emitting devices.

<Modification 2>

Figure 13:
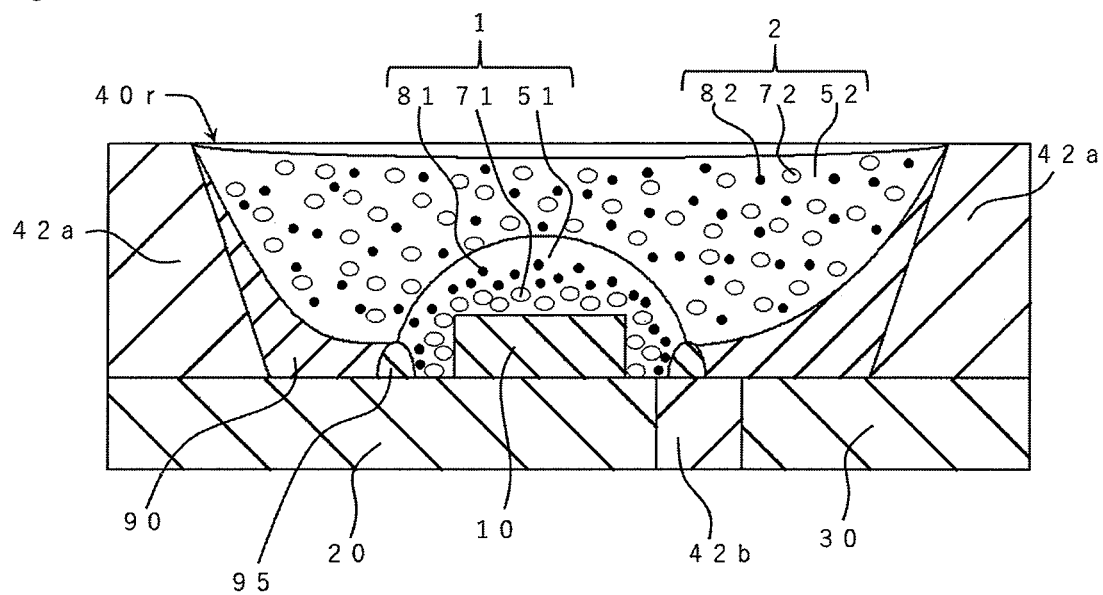
FIG. 13 is a cross-sectional view showing another modification of the light emitting device.

FIG. 13 shows another modification of the light emitting device. A light emitting device shown in FIG. 13 has a light-reflective resin 90 that surrounds the side surfaces of the light emitting element 10, and a damming portion 95 that dams the light-reflective resin 90 such that the light-reflective resin 90 is spaced away from the side surfaces of the light emitting element 10.

The light-reflective resin 90 forms a light reflective surface within the concave portion 40r and serves to efficiently extract the light from the light emitting element 10 upward. The light-reflective resin 90 is preferably a member that is less likely to transmit or absorb light from the light emitting element 10, external light, and the like. The light-reflective resin 90 is preferably white. A thermosetting resin, a thermoplastic resin, or the like may be used as a resin material for a base material of the light-reflective resin 90. Specific examples usable for the resin material include a phenol resin, an epoxy resin, a BT resin, PPA, a silicone resin, and the like. The light-reflective resin 90 contains a light-reflective material in the resin material serving as the base material. The light-reflective material is preferably a material that is less likely to absorb light from the light emitting element and has a large difference in the refractive index from the resin material as the base material. Examples of such a light-reflective material include a titanium oxide, a zinc oxide, a silicon oxide, a zirconium oxide, an aluminum oxide, and an aluminum nitride.

The light-reflective resin 90 preferably has a higher light reflectance than the molded resin portion 42. For example, the content of the light-reflective material (for example, a titanium oxide) contained in the light-reflective resin 90 is larger than the content of the light-reflective material (for example, a titanium oxide) contained in the molded resin portion 42. Specifically, the content of the light-reflective material contained in the light-reflective resin 90 is preferably 1.5 times or more, more preferably 2 times or more, and still more preferably 2.5 times or more larger than the content of the light-reflective material contained in the molded resin portion 42. For example, the light-reflective resin 90 contains 30 to 75% by weight of a titanium oxide in the total weight of the uncured resin material, while the molded resin portion 42 contains 15 to 20% by weight of a titanium oxide in the total weight of the uncured resin material.

The damming portion 95 is positioned at the bottom surface of the concave portion 40r. The damming portion 95 has a function of preventing the contact of the light-reflective resin 90 with the side surfaces of the light emitting element 10. The light-reflective resin 90 does not directly cover the side surfaces of the light emitting element 10, so that the light emitted from the side surfaces of the light emitting element 10 may be prevented from being trapped in the light-reflective resin 90. The damming portion 95 may be integrally formed as a part of the molded resin portion 42 or may be formed as a member that is separate from the molded resin portion 42, by coating or the like.

The first resin layer 1 is formed in contact with the upper surface of the damming portion 95. That is, the first resin layer 1 is formed such that the outer peripheral lower end of the first resin layer 1 is positioned above the upper surface of the damming portion 95. This may easily make the amount of resin and shape of the first resin layer 1 more uniform among the light emitting devices. Consequently, when manufacturing the plurality of light emitting devices, the amount of resin and shape of the first resin layer 1 may be more uniformized among the light emitting devices, thereby effectively suppressing unevenness in the color among them. The second resin layer 2 is disposed above the first resin layer 1 and the light-reflective resin 90.

What is claimed is:

1. A method of manufacturing a light emitting device, comprising:
    preparing a base body having a concave portion;
    disposing a light emitting element at a bottom surface of the concave portion;
    disposing a first resin to cover the light emitting element, the first resin containing first phosphor particles having an average particle size of 10 μm or more and 30 μm or less and a first filler having an average particle size of 5 μm or more and 20 μm or less;
    centrifugally precipitating the first phosphor particles and the first filler toward the base body;
    temporarily curing the first resin;
    disposing a second resin on the first resin temporarily cured, the second resin containing second phosphor particles and a second filler having an average particle size of 5 nm or more and 100 nm or less;
    centrifugally precipitating the second phosphor particles and the second filler toward the first resin; and
    curing the first resin and the second resin.

2. The method according to claim 1, wherein a content of the first phosphor particles is 23 parts by weight or more and 64 parts by weight or less to 100 parts by weight of the first resin, a content of the first filler is 9 parts by weight or more and 23 parts by weight or less to 100 parts by weight of the first resin.

3. The method according to claim 1, wherein a specific gravity of the first phosphor particles is 3 or more and 8 or less, and a specific gravity of the first filler is 1 or more and 3.5 or less.

4. The method according to claim 1, wherein a content of the second phosphor particles is 17 parts by weight or more and 47 parts by weight or less to 100 parts by weight of the second resin, a content of the second filler is 0.1 parts by weight or more and 2 parts by weight or less to 100 parts by weight of the second resin.

5. The method according to claim 1, wherein an emission peak wavelength of the first phosphor particles is 650 nm or more and 670 nm or less, and the first phosphor particles contain phosphor particles comprising or made of a fluorogermanate activated by Mn.

6. The method according to claim 1, wherein an emission peak wavelength of the second phosphor particles is 430 nm or more and 500 nm or less, and the second phosphor particles contain phosphor particles comprising or made of an alkaline earth phosphate activated by Eu and containing Cl.

7. The method according to claim 1, wherein disposing the light emitting element comprises connecting the light emitting element to the base body in the concave portion, and wherein the first resin is disposed such that an upper surface of the first resin is positioned above a wire.

8. The method according to claim 1, further comprising:
disposing a third resin including third phosphor particles on a light-emitting surface of the light emitting element, and
curing or temporarily curing the third resin after disposing the light emitting element and before disposing the first resin.

9. The method according to claim 8, wherein the third resin is formed so as to not cover a side surface of the light emitting element.

10. The method according to claim 8, further comprising precipitating the third phosphor particles in the third resin before curing or temporarily curing the third resin.

* * * * *